(12) United States Patent
Rasel et al.

(10) Patent No.: US 12,482,782 B2
(45) Date of Patent: Nov. 25, 2025

(54) BUS BAR, POWER SEMICONDUCTOR MODULE ARRANGEMENT INCLUDING A BUS BAR, AND METHOD FOR PRODUCING A BUS BAR

(71) Applicant: Infineon Technologies AG, Neubiberg (DE)

(72) Inventors: Marco Rasel, Soest (DE); Steffen Knust, Paderborn (DE); Sven Sebastian Buchholz, Dortmund (DE)

(73) Assignee: Infineon Technologies AG, Neubiberg (DE)

( * ) Notice: Subject to any disclaimer, the term of this patent is extended or adjusted under 35 U.S.C. 154(b) by 437 days.

(21) Appl. No.: 18/084,144

(22) Filed: Dec. 19, 2022

(65) Prior Publication Data

US 2023/0207511 A1 Jun. 29, 2023

(30) Foreign Application Priority Data

Dec. 23, 2021 (EP) .................................. 21217430

(51) Int. Cl.
| | | |
|---|---|---|
| H01L 23/00 | (2006.01) | |
| H01L 23/055 | (2006.01) | |
| H01L 23/485 | (2006.01) | |
| H01L 23/495 | (2006.01) | |

(52) U.S. Cl.
CPC ............ *H01L 24/37* (2013.01); *H01L 23/055* (2013.01); *H01L 23/485* (2013.01); *H01L 23/49541* (2013.01); *H01L 23/49575* (2013.01); *H01L 24/29* (2013.01); *H01L 2224/2902* (2013.01); *H01L 2224/37599* (2013.01)

(58) Field of Classification Search
CPC .............................. H01L 24/37; H01L 23/055
USPC .......................................................... 257/734
See application file for complete search history.

(56) References Cited

U.S. PATENT DOCUMENTS

| | | | |
|---|---|---|---|
| 6,215,185 B1 | 4/2001 | Kikuchi et al. | |
| 2012/0300522 A1 | 11/2012 | Tokuyama et al. | |
| 2018/0013225 A1* | 1/2018 | Li | H01R 24/28 |
| 2018/0097172 A1 | 4/2018 | Krüger et al. | |
| 2019/0296269 A1* | 9/2019 | Monismith | H01M 50/193 |
| 2020/0203941 A1* | 6/2020 | Ing | H05K 1/118 |

FOREIGN PATENT DOCUMENTS

| | | |
|---|---|---|
| DE | 102018105653 A1 | 9/2019 |
| EP | 0919041 B1 | 11/2001 |
| EP | 2232537 B1 | 8/2014 |
| EP | 3748835 A1 | 12/2020 |

* cited by examiner

*Primary Examiner* — Quoc D Hoang
(74) *Attorney, Agent, or Firm* — Murphy, Bilak & Homiller, PLLC

(57) ABSTRACT

A bus bar for a power semiconductor module arrangement includes a first end, and a second end. The first end is configured to be arranged inside a housing of the power semiconductor module arrangement. The second end is configured to be arranged outside of the housing and to be electrically contacted by an external bus bar. The second end includes a structured area that includes a plurality of protrusions. A height of each of the protrusions is between 10 μm and 1000 μm.

17 Claims, 3 Drawing Sheets

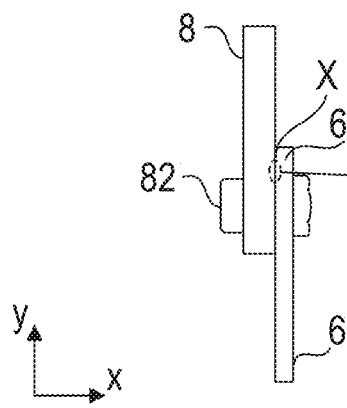 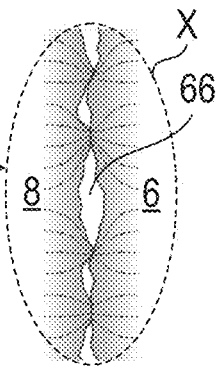
FIG 3A  FIG 3B
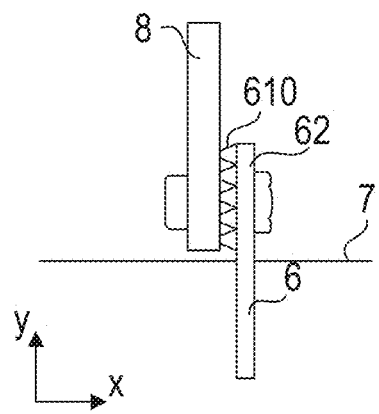 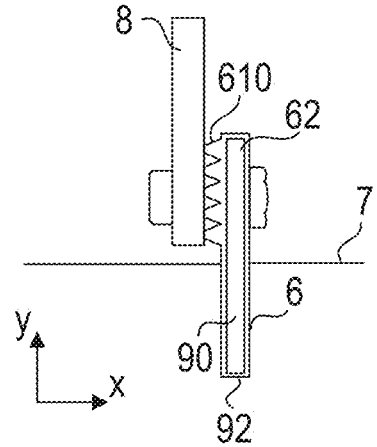 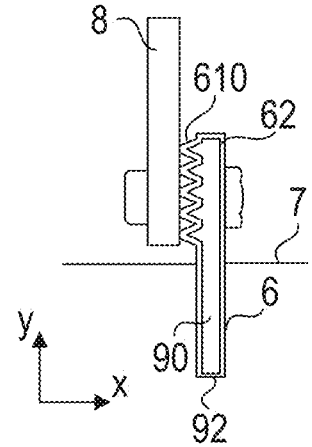
FIG 4  FIG 5  FIG 6
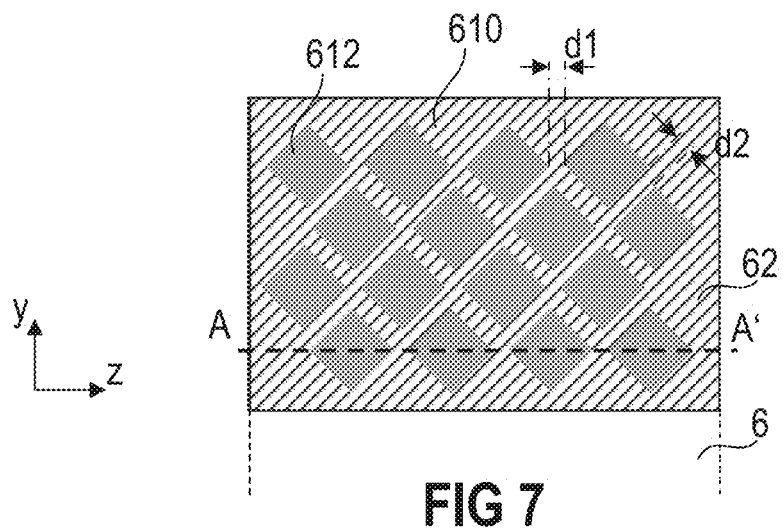
FIG 7 ively, if the existence of a "third element" and a "second element". An electrical line or electrical connection as described herein may be a single electrically conductive element, or include at least two individual electrically conductive elements connected in series and/or parallel. Electrical lines and electrical connections may include metal and/or semicon-

BUS BAR, POWER SEMICONDUCTOR MODULE ARRANGEMENT INCLUDING A BUS BAR, AND METHOD FOR PRODUCING A BUS BAR

TECHNICAL FIELD

The instant disclosure relates to a bus bar for a power semiconductor module arrangement, to a semiconductor module arrangement comprising a bus bar, and to a method for producing a bus bar.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate.

Electrically conducting terminal elements are usually provided that allow to electrically contact the semiconductor elements from outside of the housing. Such electrically conducting terminal elements often include one or more bus bars, for example, that are configured to provide a supply voltage/load current to the power semiconductor module arrangement. The bus bars of a power semiconductor module arrangement are usually contacted by external bus bars that are coupled to a power or voltage source. A good electrical conductivity needs to be ensured between the bus bars of the power semiconductor module arrangement and the external bus bars.

There is a need for a bus bar and a power semiconductor module arrangement comprising a bus bar that facilitate an improved electrical contact between the internal and external bus bars.

SUMMARY

A bus bar for a power semiconductor module arrangement includes a first end, and a second end, wherein the first end is configured to be arranged inside a housing of a power semiconductor module arrangement, the second end is configured to be arranged outside of the housing and to be electrically contacted by an external bus bar, and the second end includes a structured area including a plurality of protrusions, wherein a height of each of the protrusions is between 10 μm and 1000 μm.

A power semiconductor module arrangement includes a housing, a substrate arranged inside the housing, and at least one bus bar, wherein the first end of each of the at least one bus bar is arranged inside the housing and electrically and mechanically coupled to the substrate, and the second end of each of the at least one bus bar extends to the outside of the housing A method includes forming a bus bar including a first end and a second end, and forming a structured area at the second end, the structured area including a plurality of protrusions, wherein a height of each of the protrusions is between 10 μm and 1000 μm.

A bus bar for contacting a bus bar of a power semiconductor module arrangement includes a first end and a second end, wherein the first end of the bus bar is configured to be coupled to a power or voltage source, the second end of the bus bar is configured to electrically contact the second end of a bus bar of a power semiconductor arrangement that is arranged outside of a housing, and the second end of the bus bar includes a structured area comprising a plurality of protrusions, wherein a height of each of the protrusions is between 10 μm and 1000 μm.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 3A schematically illustrates a cross-sectional view of a conventional connection between a bus bar of a power semiconductor module arrangement and an external bus bar, and FIG. 3B schematically illustrates a section of the contact surface between the bus bars in greater detail.

FIG. 4 schematically illustrates a cross-sectional view of a connection between an external bus bar and a bus bar for a power semiconductor module arrangement according to one example.

FIG. 5 schematically illustrates a cross-sectional view of a connection between an external bus bar and a bus bar for a power semiconductor module arrangement according to another example.

FIG. 6 schematically illustrates a cross-sectional view of a connection between an external bus bar and a bus bar for a power semiconductor module arrangement according to another example.

FIG. 7 schematically illustrates a front view of a section of a bus bar for a power semiconductor module arrangement according to one example.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
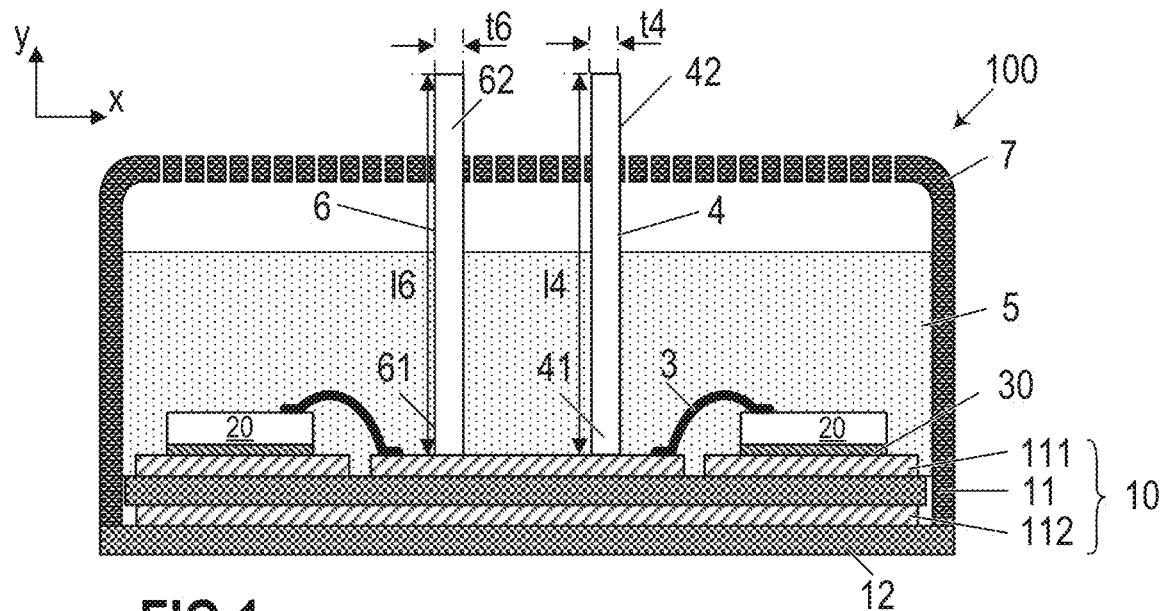
FIG. 1 is a cross-sectional view of a conventional power semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises sidewalls and a cover. This is, however, only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7. According to another example, the base plate 12 is omitted and the substrate 10 itself forms a ground surface of the housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connections 3 such as, e.g., bonding wires. Electrical connections 3 may also include connection plates or conductor rails, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, e.g., a sintered silver powder, for example.

According to other examples, it is also possible that the second metallization layer 112 is a structured layer. It is further possible to omit the second metallization layer 112 altogether. It is generally also possible that the first metallization layer 111 is a continuous layer, for example.

The power semiconductor module arrangement 100 illustrated in FIG. 1 further includes terminal elements 4. Only one terminal element 4 is schematically illustrated in FIG. 1. A power semiconductor module arrangement 100, however, generally may include a plurality of terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of each of the terminal elements 4 protrudes out of the housing 7. The terminal elements 4 may be electrically contacted from the outside at their respective second ends 42. A first part of the terminal elements 4 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The second ends 42 of the terminal elements 4 that are arranged outside the housing 7 may also extend in the vertical direction y, or may be bent such that they at least partly extend in a horizontal direction x in parallel to the substrate 10. The terminal element 4 illustrated in FIG. 1, however, is only an example. Terminal elements 4 may be implemented in any other way and may be arranged anywhere within the housing 7. For example, one or more terminal elements 4 may be arranged close to or adjacent to the sidewalls of the housing 7. Terminal elements 4 could also protrude through the sidewalls of the housing 7 instead of through the cover. The first end 41 of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end 41 of a terminal element 4 may also be electrically coupled to the substrate 10 via one or more electrical connections 3, for example. For example, the second end 42 of a terminal element 4 may be connected to a printed circuit board (not illustrated in FIG. 1).

A power semiconductor module arrangement 100 may further comprise one or more bus bars 6. Only one bus bar 6 is exemplarily illustrated in FIG. 1. A power semiconductor module arrangement 100, however, often comprises two or even more bus bars 6. The terminal elements 4 are generally configured to conduct control signals to and from the substrate 10. Control signals usually comprise electrical signals of 15V or less and are configured to control the function of the different semiconductor bodies 20. It is, however, also necessary to provide supply voltages/load currents to the power semiconductor module arrangement 100. The power semiconductor module arrangement 100 switches from an off state (non-working state) to an on state (working state), for example, when a supply voltage/load current is provided. Supply voltages are generally significantly higher with more than 100V, more than 300V, more than 600V and even up to several thousands of volts. The supply voltage can be between 500V and 10 kV, or between 600V and 6.5 kV, for example. The at least one bus bar 6 is configured to provide such a supply voltage. The corresponding load currents are also comparably high.

Figure 2:
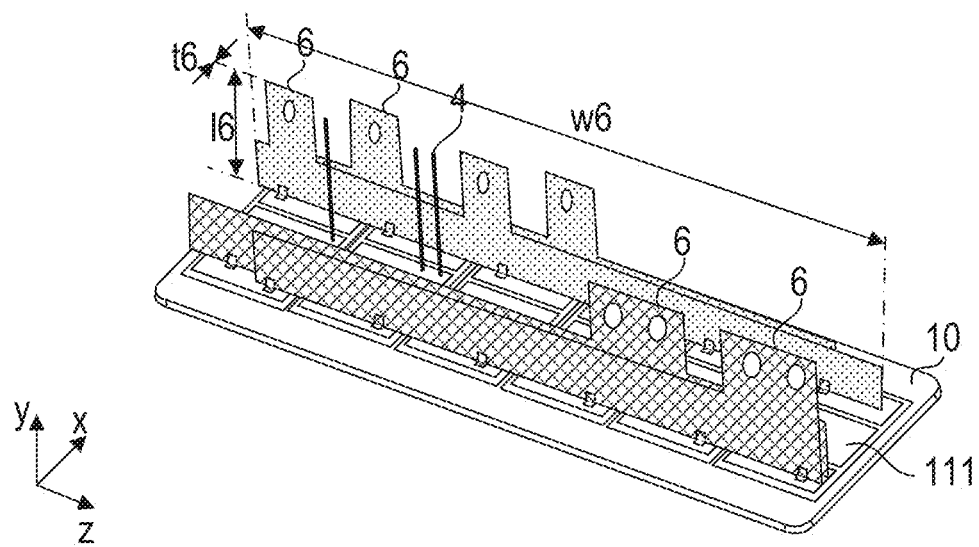
FIG. 2 is a three-dimensional view of another conventional power semiconductor module arrangement.

The terminal elements 4 can comprise simple pins, as is exemplarily illustrated in FIG. 2. The bus bars 6, on the other hand, in order to be able to provide the significantly higher supply voltages as well as higher currents, have a larger cross-sectional area as compared to the terminal elements 4. According to one example, each of the at least one bus bar 6 comprises a metal sheet. This will be described in further detail below.

The power semiconductor module arrangement 100 may further include an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 and the at least one bus bar 6 may be partly embedded in the encapsulant 5. At least their second ends 42, 62, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

As has been described above, the terminal elements 4 that have to provide comparably small voltages (and currents) generally have a comparably small cross-sectional area. That is, a length 14 of a terminal element 4 between its first end 41 and its second end 42 is generally significantly larger than its greatest thickness (or width) t4. The terminal elements 4 may have a round, oval, square, or rectangular cross-sectional area, for example. That is, the terminal elements 4 may be simple pins, for example The greatest thickness t4 of a terminal element 4 may be defined by its diameter, its width or a greatest extension in a direction that is perpendicular to the length 14 (e.g., perpendicular to the vertical direction y). In a round terminal element 4, for example, the greatest thickness t4 is defined by the diameter of the terminal element 4, while in a terminal element 4 having a rectangular cross-section, the greatest thickness t4 is defined by the length of the longitudinal sides which are generally longer than the narrow sides. According to one example, each of the at least one terminal element 4 has a length 14 between its first and second end 41, 42 that is at least ten times, at least twenty times, or at least thirty times its greatest thickness t4.

Due to their comparably small cross sectional area, however, the terminal elements 4 may not be able to withstand the much higher load currents. A supply voltage/load current, therefore, may be provided by means of bus bars 6. The power semiconductor module arrangement 100 may comprise at least two bus bars 6, for example. One bus bar 6 may be configured to be coupled to a positive potential (e.g., DC+), and another bus bar 6 be configured to be coupled to a negative potential (e.g., DC−). In order to be able to withstand the comparably large load current, each bus bar 6 may have a length 16 and a width w6 that are larger (e.g., at least 10 times larger, at least 30 times larger, or even at least 50 times larger) than a thickness t6 of the bus bar 6 (see, e.g., FIGS. 1 and 2). A length 16 of a bus bar 6 may be less than ten times, or less than five times the width w6 of the bus bar 6, for example. It is even possible that the width w6 is larger than the length 16 of the bus bar 6, as is schematically illustrated in FIG. 2. The width w6 represents the greatest thickness or greatest extension of the bus bar 6 in a direction perpendicular to its length 16, similar to what has been described with respect to the terminal elements 4 above. By significantly increasing the width w6, the cross-sectional area of the bus bars 6 is large (e.g., at least five times, at least ten times, or at least thirty times) as compared to the cross-sectional area of the terminal elements 4. Each of the at least two bus bars 6 comprises a first end 61 that is electrically and mechanically coupled to the substrate 10, and a second end 62 extending to the outside of the housing 7. A thickness t6 of the bus bars 6 may be between 0.5 and 2 mm (millimeters), e.g., 1 mm. The bus bars 6 illustrated is FIGS. 1 and 2 are straight between their first and second end 61, 62. It is, however, also possible that a bus bar 6 is bent at least once along its length 16.

Now referring to FIGS. 3A and 3B, the second end 62 of a bus bar 6 arranged in a power semiconductor module arrangement (power semiconductor module arrangement not specifically illustrated in FIGS. 3A and 3B) may be electrically and mechanically contacted by means of an external bus bar 8, for example. The external bus bar 8 is generally provided by a customer after having purchased the power semiconductor module arrangement 100. In this way, the supply voltages/load currents may be supplied to the power semiconductor module arrangement 100 from a voltage or power source via the external bus bar 8 and the internal bus bar 6 of the power semiconductor module arrangement. The internal bus bar 6 and the external bus bar 8 are often mechanically coupled to each other by means of screws 82, as is schematically illustrated in FIG. 3A. That is, a section of the internal bus bar 6 overlaps with and is pressed against a section of the external bus bar 8. The internal bus bar 6 and the corresponding external bus bar 8 each may comprise a through hole (as indicated for the internal bus bars 6 in FIG. 2, for example) through which a screw 82 may be inserted. By fastening the screw 82, the internal bus bar 6 and the external bus bar 8 may be pressed against each other in order to form a stable electrical connection. The internal bus bar 6 and the external bus bar 8 generally comprise a flat surface. However, while the surfaces seem to be flat macroscopically, the surfaces may still comprise a certain roughness or unevenness on a microscopic level, as is indicated in the microscopic view of FIG. 3B. This may result in a reduction of the electrical conductivity between the internal bus bar 6 and the external bus bar 8.

The internal bus bar 6 and the external bus bar 8 may each include a metal sheet, for example. A thin oxide layer 66 may form on the metal sheets when they come into contact with oxygen. When the internal bus bar 6 and the external bus bar 8 are connected to each other, this oxide layer 66 may reduce the electrical conductivity between the two bus bars 6, 8. By pressing the internal bus bar 6 and the external bus bar 8 toward each other with a high force (e.g., by means of the screw 82), the oxide layer 66 between the internal bus bar 6 and the external bus bar 8 may be partially disrupted. However, due to the roughness or unevenness of the metal sheets, the oxide layer 66 cannot be entirely disrupted (see FIG. 3B). The spots in which the oxide layer 66 is disrupted and the internal bus bar 6 and the external bus bar 8 are in direct contact with each other may also be referred to as alpha-spots. Such alpha-spots may be present in less than 1% of the visible contact area. When the internal bus bar 6 and the external bus bar 8 are pressed against each other with a high force, the size of the real contact area (the overall size of the areas in which the oxide layer 66 is disrupted (alpha-spots)), however, is generally not known. Therefore, it is difficult or even impossible to determine the actual electrical conductivity between the two bus bars 6, 8.

Now referring to FIG. 4, a bus bar 6 according to one example is schematically illustrated. In particular, the second end 62 of the bus bar 6, which extends to the outside of the housing 7, is schematically illustrated, while the first end 61 contacting the substrate 10 is not specifically illustrated. The second end 62 comprises a structured area 610 comprising a plurality of protrusions. In FIG. 4, five protrusions are schematically illustrated for illustration purposed only. The dimensions of the protrusions as illustrated in FIG. 4 are not necessarily to scale. By providing a plurality of protrusions, the apparent visible contact area between the internal bus bar 6 and the external bus bar 8 is reduced, as compared to conventional arrangements in which the bus bars 6, 8 have flat contact surfaces. In this way, the pressure exerted by the screw 82 (or in any other suitable way) which presses the internal bus bar 6 and the external bus bar 8 against each other is distributed over a smaller area. This resulting contact area between the internal bus bar 6 and the external bus bar 8 is defined by the number of protrusions and by the size of the top surface of each of the protrusions, wherein the top surface of a protrusion is a surface of the protrusions facing away from the internal bus bar 6 and which is pressed onto the external bus bar 8.

The reduction of the contact area results in a much higher force taking effect in each of the points of contact, as the same amount of force is distributed over a smaller area, as compared to bus bars 6, 8 having flat surfaces. Therefore, the oxide layer 66 may be disrupted more reliably at the defined points of contact that are provided by the protrusions. As already mentioned above, the resulting actual contact area may be defined by the number of the plurality of protrusions and by the size of the top surface of each of the protrusions. A certain number of protrusions and size of the top surface of each of the protrusions may be required in order to provide a satisfying electrical contact between the internal bus bar 6 and the external bus bar 8. The contact area 610 may be defined by the overlap between the internal bus bar 6 and the external bus bar 8, for example. That is, the contact area 610 is the area of the internal bus bar 6 that would be contacted by the external bus bar 8, if no protrusions 612 were provided on the internal bus bar 6. The electrical contact may increase, if the sum of the size of the top surfaces of the plurality of protrusions 612 is more than 30% of the contact area 610. However, at a certain point the electrical contact may begin to decrease again, when the sum of the size of the top surfaces of the plurality of protrusions 612 approaches the size of the contact area 610 between two substantially flat surfaces, because the oxide layer may no longer be reliably disrupted. Therefore, according to one example, the sum of the size of the top surfaces of the plurality of protrusions 612 may be less than 80% of the contact area 610.

As has been mentioned above, the internal bus bar 6 may comprise a metal sheet 90. The metal sheet 90 may be covered by an electrically conducting layer 92, as is schematically illustrated in FIGS. 5 and 6. The metal sheet 90 may comprise a first material such as copper, aluminum, brass, gold, silver, or an alloy of any of these materials, for example. The conducting layer 92 may comprise a second material that is different from the first material such as, e.g., nickel, tin, or silver.

According to one example, as is schematically illustrated in FIG. 5, the metal sheet 90 has a flat surface, and the electrically conducting layer 92 has a second thickness that is locally increased in order to form the plurality of protrusions.

According to another example, as is schematically illustrated in FIG. 6, the metal sheet 90 may have a flat surface, wherein a thickness of the metal sheet 90 is locally increased in order to form the plurality of protrusions. The electrically conducting layer 92 covering the metal sheet 90 in this example has an essentially homogenous second thickness.

That is, the protrusions can either be formed by the metal sheet 90, or by the conducting layer 92. According to one example, a method for forming a bus bar 6 comprises a stamping process. That is, the bus bar 6 may be stamped out of a large metal sheet. The protrusions may then be formed on the metal sheet 90 by means of any suitable process such as, e.g., grinding, milling, rolling, stamping, fine stamping, laser etching, etching, or lithography. The electrically conducting layer 92 may subsequently be formed on the metal sheet 90 with the protrusions formed thereon. According to another example, however, it is also possible that after forming the bus bar 6, e.g., by means of a stamping process, the bus bar 6 is coated with the electrically conducting layer 92 first, and the protrusions are subsequently formed in any suitable way. The protrusions may alternatively be formed by applying the electrically conducting layer 92 with a varying thickness, for example. The protrusions may be formed in any other suitable way.

The protrusions 612, i.e., the top surfaces of the plurality of protrusions 612, may have any suitable cross-section such as, e.g., a square, rectangular polygonal, triangular, round, oval, honeycomb-shaped, or diamond shaped cross-section. In FIG. 7, protrusions 612 having a square or diamond shaped top surface are schematically illustrated. In the example illustrated in FIG. 7, the protrusions 612 are arranged in a regular pattern. This, however, is not essential. The protrusions 612 may also be arranged in an irregular pattern.

Figure 8A:
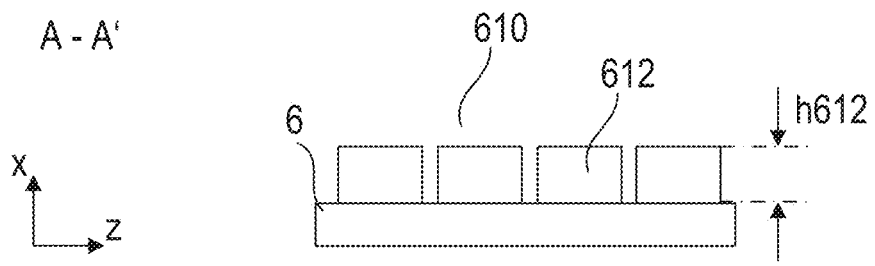
FIGS. 8A-8D schematically illustrate protrusions of a bus bar for a power semiconductor module arrangement according to several different examples.
Figure 8B:
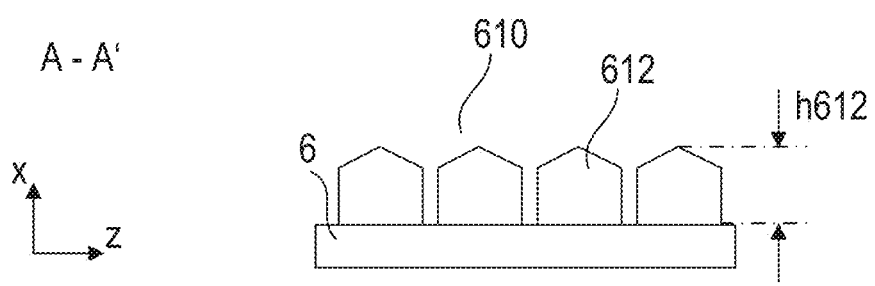
Figure 8C:
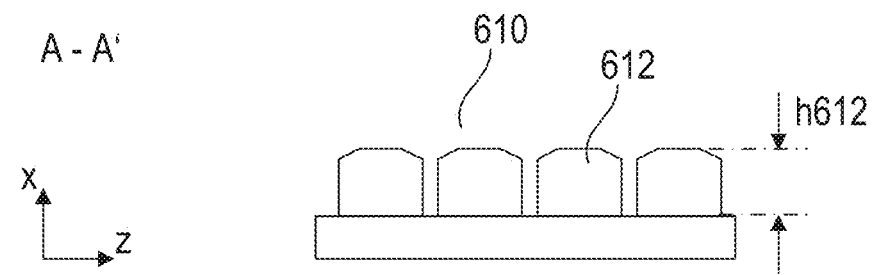
Figure 8D:
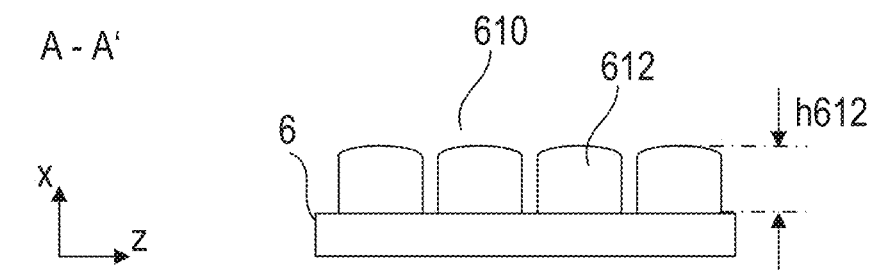

The top surface of each of the at least one protrusion 612 may be flat, pointed, or rounded, for example, as is schematically illustrated in FIGS. 8A to 8D. This may result in different sizes of the top surfaces of the protrusions 612. For example, the top surface of a pointed protrusion 612 as illustrated in FIG. 8B is smaller than the top surface of an entirely flat top surface as illustrated in FIG. 8A. The form of the protrusions 612 and, therefore, the size of the top surfaces may be chosen depending on the application the power semiconductor module is to be used in and the desired electrical conductivity between the internal bus bar 6 and the external bus bar 8. A height h612 of each of the protrusions 612, that is, a distance between the top surface of the protrusion and the metal sheet, may be between 10 µm and 1000 µm, for example. The protrusions 612, therefore, have a height h612 that is significantly larger than the usual roughness of a flat surface, as has been described with respect to FIGS. 3A-3B above.

Those parts of the internal bus bar 6 that are arranged inside the housing 7 may not comprise any protrusions 612 as this may result in unwanted parasitic effects.

In the examples described herein, the structured area 610 is arranged at a second end 62 of an internal bus bar 6, which is contacted by an external bus bar 8. It is, however, also possible to provide an external bus bar 8 comprising a structured area, instead. The structured area of an external bus bar may be implemented in the same way as has been described with respect to the internal bus bar 6 above. If a structured area is provided on an external bus bar 8, the internal bus bar 6 may not comprise a structured area 610, but a flat area instead. That is, a bus bar 8 for contacting a bus bar 6 of a power semiconductor module arrangement may comprise a first end and a second end, wherein the first end of the bus bar 8 is configured to be coupled to a power or voltage source, the second end of the bus bar 8 is configured to electrically contact the second end of a bus bar 6 of a power semiconductor arrangement that is arranged outside of a housing 7, and the second end of the bus bar 8 comprises a structured area comprising a plurality of protrusions, wherein a height of each of the protrusions is between 10 µm and 1000 µm.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A bus bar for a power semiconductor module arrangement, the bus bar comprising:
    a metal sheet comprising a first material;
    a first end configured to be arranged inside a housing of the power semiconductor module arrangement; and
    a second end configured to be arranged outside of the housing and to be electrically contacted by an external bus bar,
        wherein the second end comprises a structured area comprising a plurality of protrusions,
        wherein a height of each of the protrusions is between 10 µm and 1000 µm,
        wherein the metal sheet is covered by an electrically conducting layer comprising a second material that is different from the first material,
        wherein the metal sheet has a flat surface,
        wherein a thickness of the metal sheet is locally increased to form the plurality of protrusions,
        wherein the electrically conducting layer has an essentially homogenous second thickness.

2. The bus bar of claim 1, wherein the first material comprises at least one of copper, aluminum, brass, gold, silver, and their alloys, and wherein the second material comprises at least one of nickel, tin, and silver.

3. The bus bar of claim 1, wherein a top surface of each protrusion is flat, pointed, or rounded, and wherein the top surface is a surface of the protrusion facing away from the bus bar.

4. The bus bar of claim 3, wherein each top surface has a square, rectangular polygonal, triangular, round, oval, honeycomb-shaped, or diamond shaped cross-section.

5. The bus bar of claim 1, wherein the plurality of protrusions is arranged in a regular pattern.

6. A power semiconductor module arrangement, comprising:
    a housing;
    a substrate arranged inside the housing; and
    at least one bus bar of claim 1,
        wherein the first end of each of the at least one bus bar is arranged inside the housing and electrically and mechanically coupled to the substrate,
        wherein the second end of each of the at least one bus bar extends to an outside of the housing.

7. The power semiconductor module arrangement of claim 6, wherein each of the at least one bus bar is configured to provide a supply voltage of more than 100V.

8. A bus bar for a power semiconductor module arrangement, the bus bar comprising:
    a metal sheet comprising a first material;
    a first end configured to be arranged inside a housing of the power semiconductor module arrangement; and
    a second end configured to be arranged outside of the housing and to be electrically contacted by an external bus bar,
        wherein the second end comprises a structured area comprising a plurality of protrusions,
        wherein a height of each of the protrusions is between 10 µm and 1000 µm,
        wherein the metal sheet is covered by an electrically conducting layer comprising a second material that is different from the first material,
        wherein the metal sheet has a flat surface,
        wherein the electrically conducting layer has a second thickness that is locally increased to form the plurality of protrusions.

9. The bus bar of claim 8, wherein the first material comprises at least one of copper, aluminum, brass, gold, silver, and their alloys, and wherein the second material comprises at least one of nickel, tin, and silver.

10. The bus bar of claim 8, wherein a top surface of each protrusion is flat, pointed, or rounded, and wherein the top surface is a surface of the protrusion facing away from the bus bar.

11. The bus bar of claim 10, wherein each top surface has a square, rectangular polygonal, triangular, round, oval, honeycomb-shaped, or diamond shaped cross-section.

12. The bus bar of claim 8, wherein the plurality of protrusions is arranged in a regular pattern.

13. A bus bar for a power semiconductor module arrangement, the bus bar comprising:
    a first end configured to be arranged inside a housing of the power semiconductor module arrangement; and
    a second end configured to be arranged outside of the housing and to be electrically contacted by an external bus bar,
        wherein the second end comprises a first side face configured to physically contact the external bus bar, a second side face opposite the first side face, and an end face extending between the first side face and the second side face, wherein the second side face of the second end is configured to not be in physical contact with the external bus bar when the first side face is in physical contact with the external bus bar, wherein the first side face of the second end comprises a structured area comprising a plurality of protrusions, wherein a height of each of the protrusions is between 10 μm and 1000 μm.

14. The bus bar of claim 13, wherein the first material comprises at least one of copper, aluminum, brass, gold, silver, and their alloys, and wherein the second material comprises at least one of nickel, tin, and silver.

15. The bus bar of claim 13, wherein a top surface of each protrusion is flat, pointed, or rounded, and wherein the top surface is a surface of the protrusion facing away from the bus bar.

16. The bus bar of claim 15, wherein each top surface has a square, rectangular polygonal, triangular, round, oval, honeycomb-shaped, or diamond shaped cross-section.

17. The bus bar of claim 13, wherein the plurality of protrusions is arranged in a regular pattern.

* * * * *